(12) United States Patent
Yanagizawa et al.

(10) Patent No.: US 11,349,156 B2
(45) Date of Patent: May 31, 2022

(54) POWER SUPPLY DEVICE

(71) Applicant: TOYOTA JIDOSHA KABUSHIKI KAISHA, Toyota (JP)

(72) Inventors: Naoki Yanagizawa, Nagakute (JP);
Shuji Tomura, Nagakute (JP);
Kyosuke Tanemura, Nagakute (JP);
Kazuo Ootsuka, Nagakute (JP);
Shigeaki Goto, Nagakute (JP); Junta Izumi, Nagoya (JP); Kenji Kimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 99 days.

(21) Appl. No.: 16/656,736

(22) Filed: Oct. 18, 2019

(65) Prior Publication Data

US 2020/0136199 A1    Apr. 30, 2020

(30) Foreign Application Priority Data

Oct. 31, 2018 (JP) .............................. JP2018-204644

(51) Int. Cl.
*H01M 10/42* (2006.01)
*H03K 17/567* (2006.01)

(52) U.S. Cl.
CPC ... *H01M 10/4257* (2013.01); *H01M 10/4207* (2013.01); *H03K 17/567* (2013.01);
(Continued)

(58) Field of Classification Search
CPC ........... H01M 10/4207; H01M 10/425; H01M 10/4257; H01M 10/482;
(Continued)

(56) References Cited

U.S. PATENT DOCUMENTS 9,322,883 B2    4/2016  Danner
9,647,463 B2    5/2017  Brandl et al.
(Continued)

FOREIGN PATENT DOCUMENTS

JP    2008-282236 A      11/2008
JP    2012050272 A   *   3/2012
(Continued)

OTHER PUBLICATIONS

Machine Translation JP2014143771(A) (Year: 2014).*
(Continued)

*Primary Examiner* — Victoria H Lynch
(74) *Attorney, Agent, or Firm* — Dickinson Wright, PLLC

(57) ABSTRACT

In a power supply device including a plurality of battery modules each including a secondary battery, in which the battery modules are connected in series to one another according to a gate driving signal from a controller and in each of the battery modules, the gate driving signal is delayed in a gate driving signal processing circuit included in the battery module and then transmitted from upstream to downstream of the series connection, an ID is provided for each of the battery modules by transmitting an ID setting signal for providing an ID unique to the battery module using a gate signal line for transmitting the gate driving signal.

4 Claims, 5 Drawing Sheets

(52) U.S. Cl.
CPC ............. *H01M 2010/4271* (2013.01); *H01M 2010/4278* (2013.01)

(58) Field of Classification Search
CPC .. H01M 2010/4271; H01M 2010/4278; H03K 17/26; H03K 17/284; H03K 17/567; Y02E 60/10
See application file for complete search history.

(56) References Cited

U.S. PATENT DOCUMENTS

| | | |
|---|---|---|
| 9,866,054 B2 | 1/2018 | Lee |
| 2004/0198468 A1 | 10/2004 | Patel et al. |
| 2005/0083016 A1 | 4/2005 | Yau et al. |
| 2007/0001651 A1 | 1/2007 | Harvey |
| 2010/0141209 A1 | 6/2010 | Shiu et al. |
| 2011/0025270 A1 | 2/2011 | Nakanishi |
| 2011/0057617 A1 | 3/2011 | Finberg et al. |
| 2011/0080138 A1 | 4/2011 | Nakanishi |
| 2013/0002016 A1 | 1/2013 | Furukawa et al. |
| 2013/0026993 A1 | 1/2013 | Hintz et al. |
| 2013/0108898 A1 | 5/2013 | Potts et al. |
| 2013/0249317 A1 | 9/2013 | Kang et al. |
| 2014/0176104 A1 | 6/2014 | Lin et al. |
| 2015/0104673 A1 | 4/2015 | de Greef et al. |
| 2015/0115736 A1 | 4/2015 | Snyder |
| 2016/0233709 A1 | 8/2016 | Lee |
| 2016/0254667 A1 | 9/2016 | Lee |
| 2017/0040646 A1 | 2/2017 | Beaston |
| 2017/0077558 A1 | 3/2017 | Nystrom et al. |
| 2017/0126032 A1 | 5/2017 | Beaston |
| 2017/0163268 A1 | 6/2017 | Maeda et al. |
| 2017/0288431 A1 | 10/2017 | Lian |
| 2018/0313902 A1 | 11/2018 | Nagasue |
| 2019/0181661 A1 | 6/2019 | Shen |
| 2019/0267896 A1 | 8/2019 | Goto et al. |
| 2019/0361075 A1 | 11/2019 | Lee et al. |
| 2020/0076206 A1 | 3/2020 | Goto et al. |
| 2020/0112183 A1 | 4/2020 | Tomura et al. |
| 2020/0132780 A1 | 4/2020 | Ootsuka et al. |
| 2020/0136196 A1 | 4/2020 | Tanemura et al. |
| 2020/0136405 A1 | 4/2020 | Goto et al. |
| 2020/0136412 A1 | 4/2020 | Tomura et al. |
| 2020/0166576 A1 | 5/2020 | Yasoshima et al. |
| 2020/0169080 A1 | 5/2020 | Yasoshima et al. |
| 2020/0169081 A1 | 5/2020 | Yasoshima et al. |
| 2020/0169082 A1 | 5/2020 | Yasoshima et al. |
| 2020/0169115 A1 | 5/2020 | Yasoshima et al. |
| 2020/0176982 A1 | 6/2020 | Yasoshima et al. |
| 2020/0176983 A1 | 6/2020 | Yasoshima et al. |
| 2020/0177018 A1 | 6/2020 | Yasoshima et al. |
| 2020/0177019 A1 | 6/2020 | Yasoshima et al. |
| 2020/0177178 A1 | 6/2020 | Yasoshima et al. |
| 2020/0303785 A1 | 9/2020 | Chang et al. |
| 2021/0050734 A1 | 2/2021 | Huot-Marchand et al. |
| 2021/0075227 A1 | 3/2021 | Chang |
| 2021/0184474 A1 | 6/2021 | Kobayashi |
| 2021/0203178 A1 | 7/2021 | Tsukada et al. |

FOREIGN PATENT DOCUMENTS

| | | | | |
|---|---|---|---|---|
| JP | 2012050272 A | 3/2012 | | |
| JP | 2012-244794 A | 12/2012 | | |
| JP | 2013135477 A | 7/2013 | | |
| JP | 2013179739 A | 9/2013 | | |
| JP | 2014143771 A | * 8/2014 | ........ | H01M 10/4207 |
| JP | 2014143771 A | 8/2014 | | |
| JP | 2018-074709 A | 5/2018 | | |
| WO | 2018/079664 A1 | 5/2018 | | |
| WO | 2018179774 A1 | 10/2018 | | |

OTHER PUBLICATIONS

Machne Translation JP2012050272(A) (Year: 2012).*
Shuji Tomura et al., U.S. Appl. No. 16/654,998, filed Oct. 16, 2019.
Shuji Tomura et al., U.S. Appl. No. 16/654,998, Non-Final Office Action dated Sep. 20, 2021.

* cited by examiner

GATE SIGNAL DURING NORMAL CONTROL

GATE SIGNAL IN ID SETTING MODE

POWER SUPPLY DEVICE

INCORPORATION BY REFERENCE

The disclosure of Japanese Patent Application No. 2018-204644 filed on Oct. 31, 2018 including the specification, drawings and abstract is incorporated herein by reference in its entirety.

BACKGROUND

1. Technical Field

The present disclosure relates to a power supply device that includes battery modules connected in series and supplies power.

2. Description of Related Art

Power supply devices that have a plurality of battery modules connected in series and supply a load with electric power (power a load) are used. When the batteries included in the battery modules are secondary batteries, the power supply device can also charge these batteries from the load side (regenerate electric power).

For such power supply devices, a configuration including a switching circuit that connects and isolates the relevant battery module to and from a load based on a gate driving signal has been proposed. In this circuit configuration, voltage control is performed by driving the switching circuit of each battery module through a gate driving signal via a delay circuit.

With regard to such power supply device, techniques for communication of a signal for providing unique IDs or failure signals in the respective battery modules are disclosed (Japanese Patent Application Publication Nos. 2012-244794 and 2008-282236).

SUMMARY

However, in the conventional power supply devices, a dedicated signal line for providing an ID to each of battery modules included in a power supply device is provided. Also, although a configuration in which a gate signal line for communication of a gate driving signal is used when a failure signal is communicated is disclosed, no technique for setting an ID for each battery module using a gate signal line is disclosed.

In other words, none of the conventional power supply devices can provide an ID to a battery module using a gate signal line.

An aspect of the present disclosure provides a power supply device including a plurality of battery modules each including a secondary battery, in which the battery modules are connected in series to one another according to a gate driving signal from a controller and in each of the battery modules, the gate driving signal is delayed in a gate driving signal processing circuit included in the battery module and then transmitted from upstream to downstream of the series connection, wherein an ID is provided for each of the battery modules by transmitting an ID setting signal for providing an ID unique to the battery module using a gate signal line for transmitting the gate driving signal.

Here, if the ID setting mode instruction signal agrees with a predetermined signal waveform for transition to an ID setting mode, the gate driving signal processing circuit may enter a mode for ID setting.

Also, the gate driving signal processing circuit may change the ID setting signal received from the preceding battery module into a signal waveform for setting an ID unique to the subsequent battery module.

Also, the ID setting signal may have a pulse waveform, and the gate driving signal processing circuit may change the number of pulses of the ID setting signal received from the preceding battery module to the number of pulses for setting an ID unique to the subsequent battery module.

Also, the gate driving signal may be returned from the most downstream battery module to the controller, and the controller may acquire the number of connected battery modules based on the returned ID setting signal.

The present disclosure enables providing an ID to a battery module using a gate signal line.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
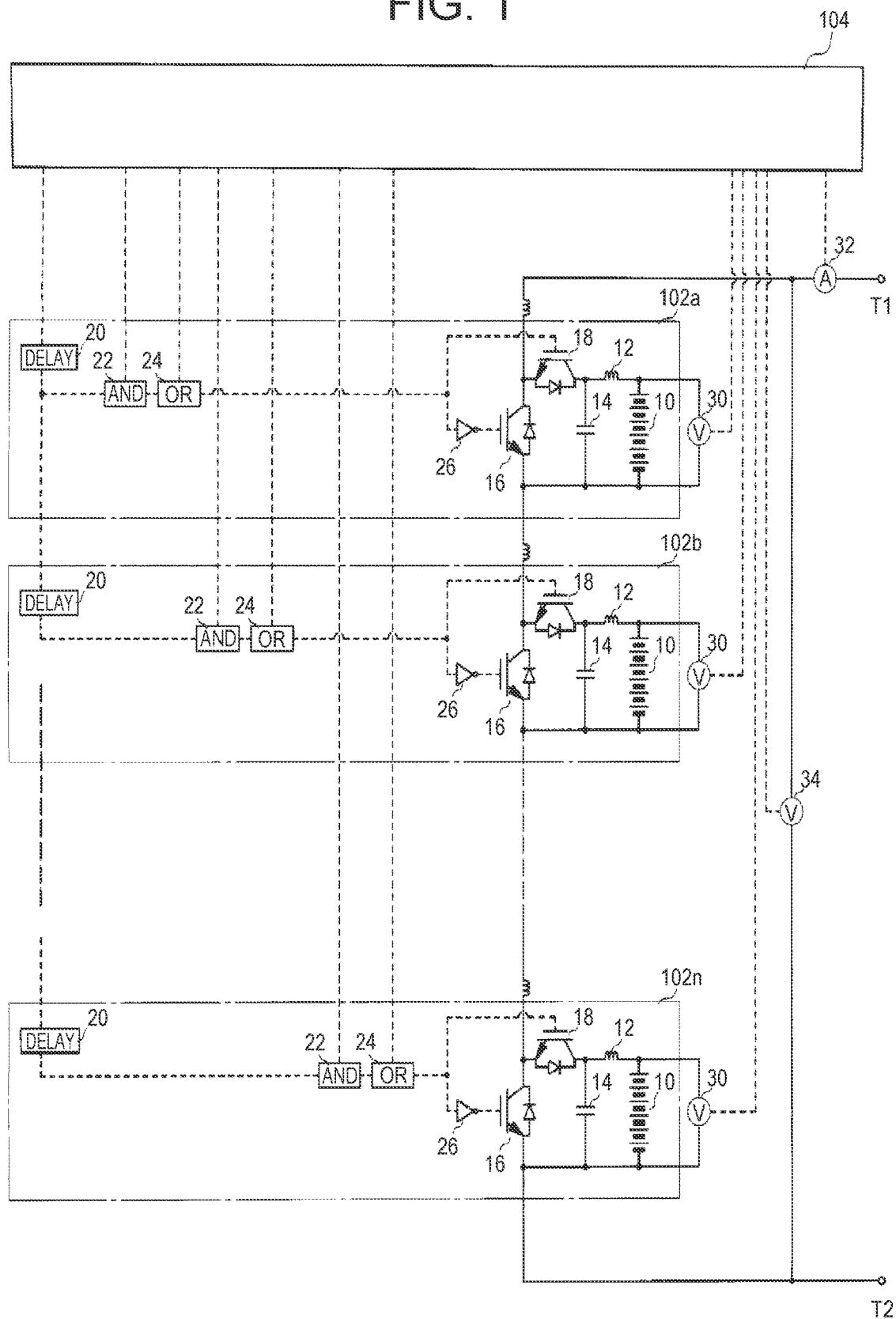
FIG. 1 is a diagram illustrating a configuration of a power supply device according to an embodiment of the present disclosure.

As illustrated in FIG. 1, a power supply device 100 according to an embodiment includes battery modules 102 and a controller 104. The power supply device 100 includes a plurality of battery modules 102 (102a, 102b, . . . 102n). The battery modules 102 can be connected in series to one another under control by the controller 104. The battery modules 102 included in the power supply device 100 can supply a load (not illustrated) connected to terminals T1 and T2 with electric power (power the load), or can be charged with electric power from a power supply (not illustrated) connected to the terminals T1 and T2 (regenerate electric power).

Each battery module 102 includes a battery 10, a choke coil 12, a capacitor 14, a first switch element 16, a second switch element 18, a gate driving signal processing circuit 20, an AND element 22, an OR element 24 and a NOT element 26. In the present embodiment, the battery modules 102 have a same configuration.

The battery 10 includes at least one secondary battery. For example, the battery 10 can have a configuration in which a plurality of lithium-ion batteries, nickel-metal hydride batteries or the like are connected in series or/and connected in parallel. The choke coil 12 and the capacitor 14 form a smoothing circuit (low-pass filter circuit) that smooths an output from the battery 10 and outputs the smoothed output. In other words, since a secondary battery is used as the battery 10, in order to reduce deterioration of the battery 10 due to an increase in internal resistance loss, an RLC filter is formed by the choke coil 12 and the capacitor 14 to smooth the current. However, the choke coil 12 and the capacitor 14 are not essential components and may be omitted.

The first switch element 16 includes a switching element for short-circuiting an output terminal of the battery 10. In the present embodiment, the first switch element 16 has a configuration in which a freewheeling diode is connected in parallel to a field-effect transistor, which is a switching element. The second switch element 18 is connected in series to the battery 10, between the battery 10 and the first switch element 16. In the present embodiment, the second switch element 18 has a configuration in which a freewheeling diode is connected in parallel to a field-effect transistor, which is a switching element. Switching of the first switch element 16 and the second switch element 18 is controlled through a gate driving signal from the controller 104. While field-effect transistors are used in the first switch element 16 and the second switch element 18 in the present embodiment, other switching elements may also be used.

The gate driving signal processing circuit 20 is a circuit that controls the battery module 102 based on the gate driving signal input from the controller 104 to the battery module 102 (as described later, an ID setting signal may be superimposed on the gate driving signal). The gate driving signal processing circuit 20 includes a delay circuit that delays the gate driving signal by a predetermined time. In the power supply device 100, gate driving signal processing circuits 20 are respectively provided in the battery modules 102 (102a, 102b, . . . 102n) and are connected in series to one another. Therefore, the gate driving signal input from the controller 104 is input to the battery modules 102 (102a, 102b, . . . 102n) sequentially while being delayed by a predetermined time at each battery module 102. Control based on the gate driving signal will be described later.

The AND element 22 constitutes disconnection means for forcibly isolating the battery module 102 from the series connection state according to a forced disconnection signal from the controller 104. Also, the OR element 24 constitutes connection means for forcibly connecting the battery module 102 to the series connection state according to a forced connection signal from the controller 104. The AND element 22 and the OR element 24 are controlled by the controller 104. A control signal from the controller 104 is input to one input terminal of the AND element 22 and the gate driving signal from the gate driving signal processing circuit 20 is input to the other input terminal. A control signal from the controller 104 is input to one input terminal of the OR element 24 and the gate driving signal from the gate driving signal processing circuit 20 is input to the other input terminal. Output signals from the AND element 22 and the OR element 24 are input to a gate terminal of the second switch element 18. Output signals from the AND element 22 and the OR element 24 are also input to a gate terminal of the first switch element 16 through the NOT element 26.

During normal control, a high (H)-level control signal is input from the controller 104 to the AND element 22 and a low (L)-level control signal is input from the controller 104 to the OR element 24. Therefore, the gate driving signal is input as it is to the gate terminal of the second switch element 18, while an inverted signal of the gate driving signal is input to the gate terminal of the first switch element 16. Thus, when the gate driving signal is high (H), the first switch element 16 is off and the second switch element 18 is on, and when the gate driving signal is low (L), the first switch element 16 is on and the second switch element 18 is off. In other words, when the gate driving signal is high (H), the battery module 102 is in a state of being connected in series to the other battery modules 102, and when the gate driving signal is low (L), the battery module 102 is in a pass-through state of being isolated from the other battery modules 102.

During forced disconnection, the controller 104 inputs a low (L)-level control signal to the AND element 22 of a battery module 102 to be forcibly isolated and inputs a low (L)-level control signal to the OR element 24 of the battery module 102. Consequently, a low (L) level is output from the AND element 22, a high (H) level is input to the gate terminal of the first switch element 16 through the OR element 24 by the NOT element 26, and a low (L) level is input to the gate terminal of the second switch element 18. Therefore, the first switch element 16 is consistently in an on state, the second switch element 18 is consistently in an off state and the battery module 102 is in a state of being forcibly isolated (pass-through state) regardless of the state of the gate signal. Such forced disconnection control can be used as control for reducing imbalance in SOC among the battery modules 102 in the power supply device 100.

During forced connection, the controller 104 inputs a high (H)-level signal to the OR element 24 of a battery module 102 to be forcibly connected. Consequently, a high (H) level is input from the OR element 24, a low (L) level is input to the gate terminal of the first switch element 16 by the NOT element 26, and a high (H) level is input to the gate terminal of the second switch element 18. Therefore, the first switch element 16 is consistently in an off state, the second switch element 18 is consistently in an on state and the battery module 102 is in a state of being forcibly connected in series regardless of the state of the gate signal. Such forced connection control can be used as control for reducing imbalance in SOC among the battery modules 102 in the power supply device 100.

The gate driving signal processing circuit 20 of the battery module 102 having brought into the forced disconnection state or the forced connection state transmits the received gate driving signal to the next battery module 102 without delaying the gate driving signal.

Normal Control

Control of the power supply device 100 will be described below with reference to FIG. 2. During normal control, a high (H)-level forced disconnection signal is input from the controller 104 to the AND element 22 of each of the battery modules 102 (102a, 102b, . . . 102n). A low (L)-level forced connection signal is input from the controller 104 to the OR elements 24 of each of the battery modules 102 (102a, 102b, . . . 102n). As a result, an inverted signal of a gate driving signal from the gate driving signal processing circuit 20 is input to the gate terminal of the first switch element 16 through the NOT element 26, while the gate driving signal from the gate driving signal processing circuit 20 is input as it is to the gate terminal of the second switch element 18.

Figure 2:
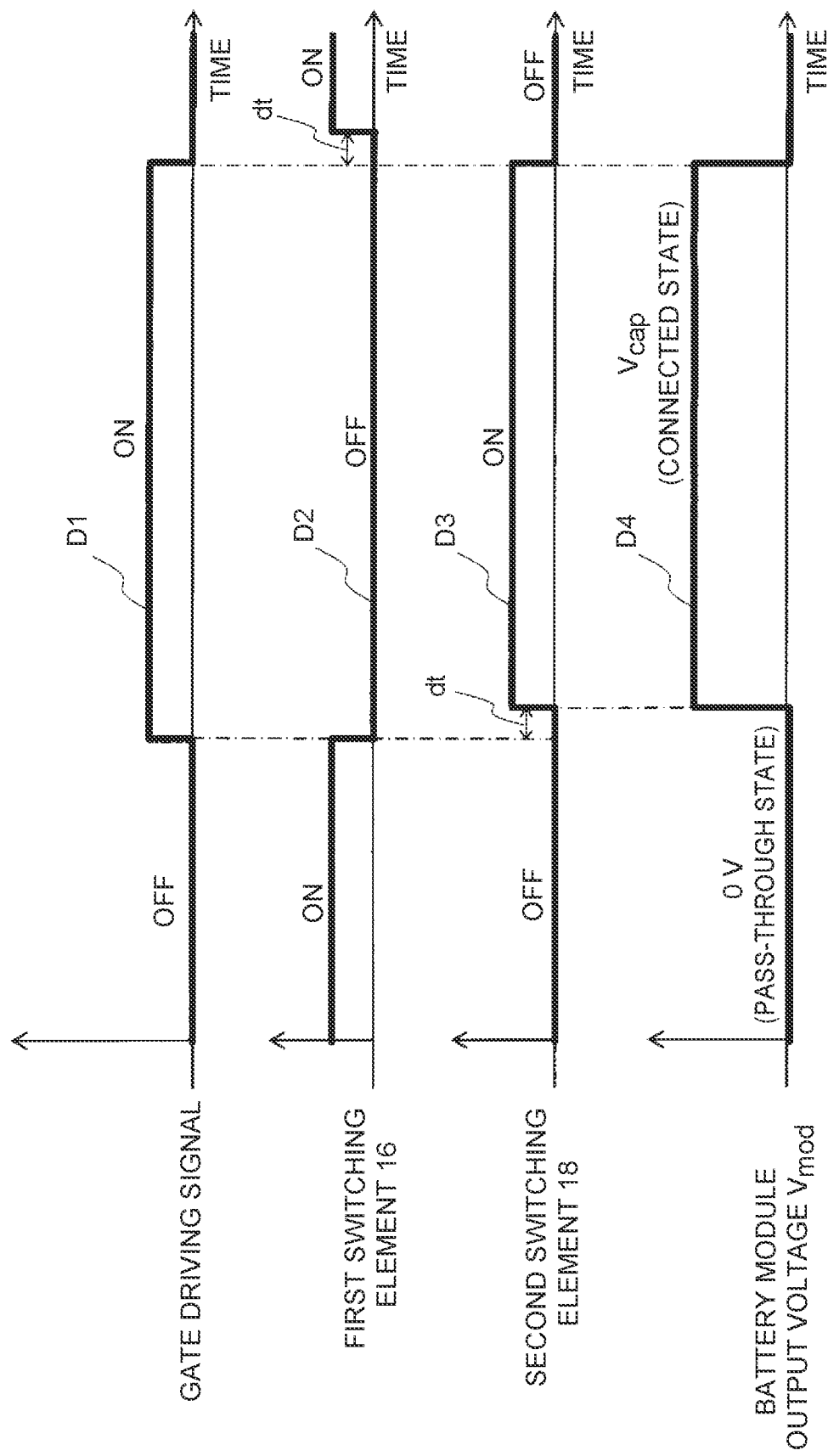
FIG. 2 is a diagram illustrating switching control using a gate driving signal according to the embodiment of the present disclosure.

FIG. 2 illustrates a time chart relating to operation of the battery module 102a. FIG. 2 illustrates a pulse waveform of a gate driving signal D1 for driving the battery module 102a, a rectangular wave D2 indicating a switching state of the first switch element 16, a rectangular wave D3 indicating a switching state of the second switch element 18 and a rectangular wave D4 of a voltage $V_{mod}$ output by the battery module 102a.

In an initial state of the battery module 102a, that is, a state in which the gate driving signal is not being output, the first switch element 16 is on and the second switch element 18 is off. When the gate driving signal is input from the controller 104 to the battery module 102a, switching of the battery module 102a is controlled by PWM control. Under the switching control, the first switch element 16 and the second switch element 18 are switched so as to be alternately turned on and off.

As illustrated in FIG. 2, when the gate driving signal D1 is output from the controller 104, the first switch element 16 and the second switch element 18 of the battery module 102a are driven according to the gate driving signal D1. The first switch element 16 switches from an on state to an off state as the signal from the NOT element 26 falls in response to a rise of the gate driving signal D1. The first switch element 16 switches from an off state to an on state with a delay of a short time (dead time dt) from a fall of the gate driving signal D1.

On the other hand, the second switch element 18 switches from an off state to an on state with a delay of a short time (dead time dt) after a rise of the gate driving signal D1. Simultaneously with a fall of the gate driving signal D1, the second switch element 18 switches from an on state to an off state. Thus, switching of the first switch element 16 and the second switch element 18 is controlled such that the first switch element 16 and the second switch element 18 are alternately turned on and off.

Note that the first switch element 16 being activated with a delay of a short time (dead time dt) from a fall of the gate driving signal D1 and the second switch element 18 being activated with a delay of a short time (dead time dt) from a rise of the gate driving signal D1 are intended to prevent the first switch element 16 and the second switch element 18 from being activated simultaneously. In other words, short circuit of the battery resulting from the first switch element 16 and the second switch element 18 being turned on simultaneously is prevented. The dead time dt that causes a delay in activation is set to, for example, 100 ns but can be set to any appropriate time. During the dead time dt, a current is circulated through the diode, which creates a same state as when a switching element parallel to this diode through which a current circulates is turned on.

Figure 3A:
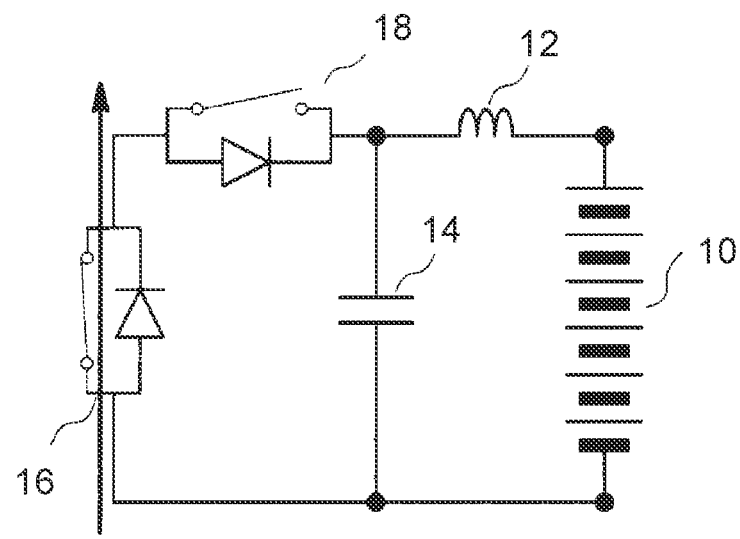
FIG. 3A is a diagram illustrating switching control using the gate driving signal according to the embodiment of the present disclosure.

In the battery module 102a thus controlled, as illustrated in FIG. 2, the capacitor 14 is isolated from an output terminal of the battery module 102a when the gate driving signal D1 is off (that is, the first switch element 16 is on and the second switch element 18 is off). Therefore, no voltage of the battery module 102a is output from the output terminal. In this state, as illustrated in FIG. 3A, the battery module 102a is in a pass-through state in which the battery 10 (capacitor 14) thereof is bypassed.

The capacitor 14 is connected to the output terminal of the battery module 102a when the gate driving signal is on (that is, the first switch element 16 is off and the second switch element 18 is on). Therefore, a voltage is output from the battery module 102a to the output terminal. In this state, as illustrated in FIG. 3B, a voltage $V_{mod}$ is output to the output terminal through the capacitor 14 of the battery module 102a.

Referring back to FIG. 1, control of the power supply device 100 by the controller 104 will be described. The controller 104 controls an entirety of the power supply device 100. In other words, the controller 104 controls an output voltage of the power supply device 100 by controlling operation of each of the battery modules 102a, 102b, 102c, ... 102n.

The controller 104 outputs the rectangular-wave gate driving signal. The gate driving signal processing circuits 20 included in the battery modules 102a, 102b, 102c, ... 102n include the respective delay circuits that delay and output the gate driving signal output from the controller 104 sequentially. Each gate driving signal processing circuit 20 delays the gate driving signal by a certain time through the relevant delay circuit and outputs the delayed gate driving signal to an adjacent battery module 102. As a result, the gate driving signal output from the controller 104 is delayed and transmitted to the battery modules 102a, 102b, 102c, ... 102n sequentially.

Figure 3B:
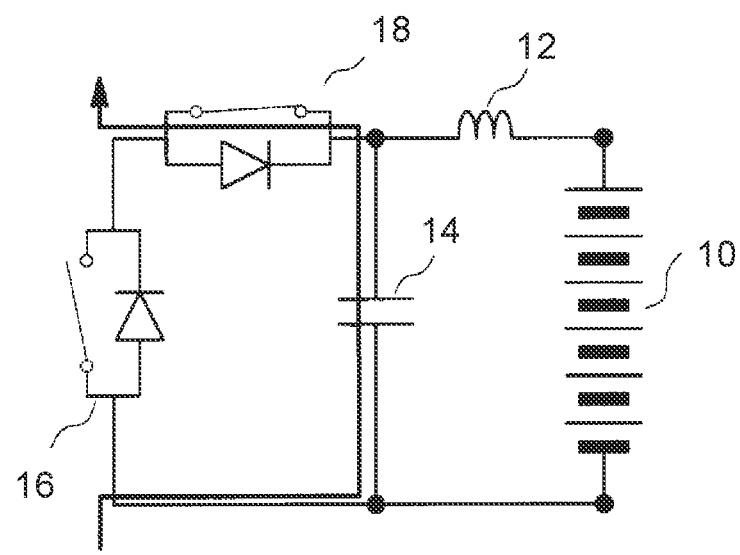
FIG. 3B is a diagram illustrating switching control using the gate driving signal according to the embodiment of the present disclosure.

In FIG. 1, when the gate driving signal is output to the battery module 102a on the most upstream side from the controller 104, as illustrated in FIG. 3A and FIG. 3B, the battery module 102a is driven and a voltage at the battery module 102a is output to an output terminal OT. Also, the gate driving signal is delayed by a certain time through the gate driving signal processing circuit 20 of the battery module 102a and then input to the adjacent battery module 102b. The gate driving signal causes the battery module 102b to be driven as in the battery module 102a. The gate driving signal is further delayed by a certain time through the gate driving signal processing circuit 20 of the battery module 102b and input to the adjacent battery module 102c. Likewise, the gate driving signal is subsequently delayed and input to each of the battery modules on the downstream side. Then, the battery modules 102a, 102b, 102c, ... 102n are sequentially driven and voltages of the battery modules 102a, 102b, 102c, ... 102n are sequentially output to respective output terminals OT.

Figure 4:
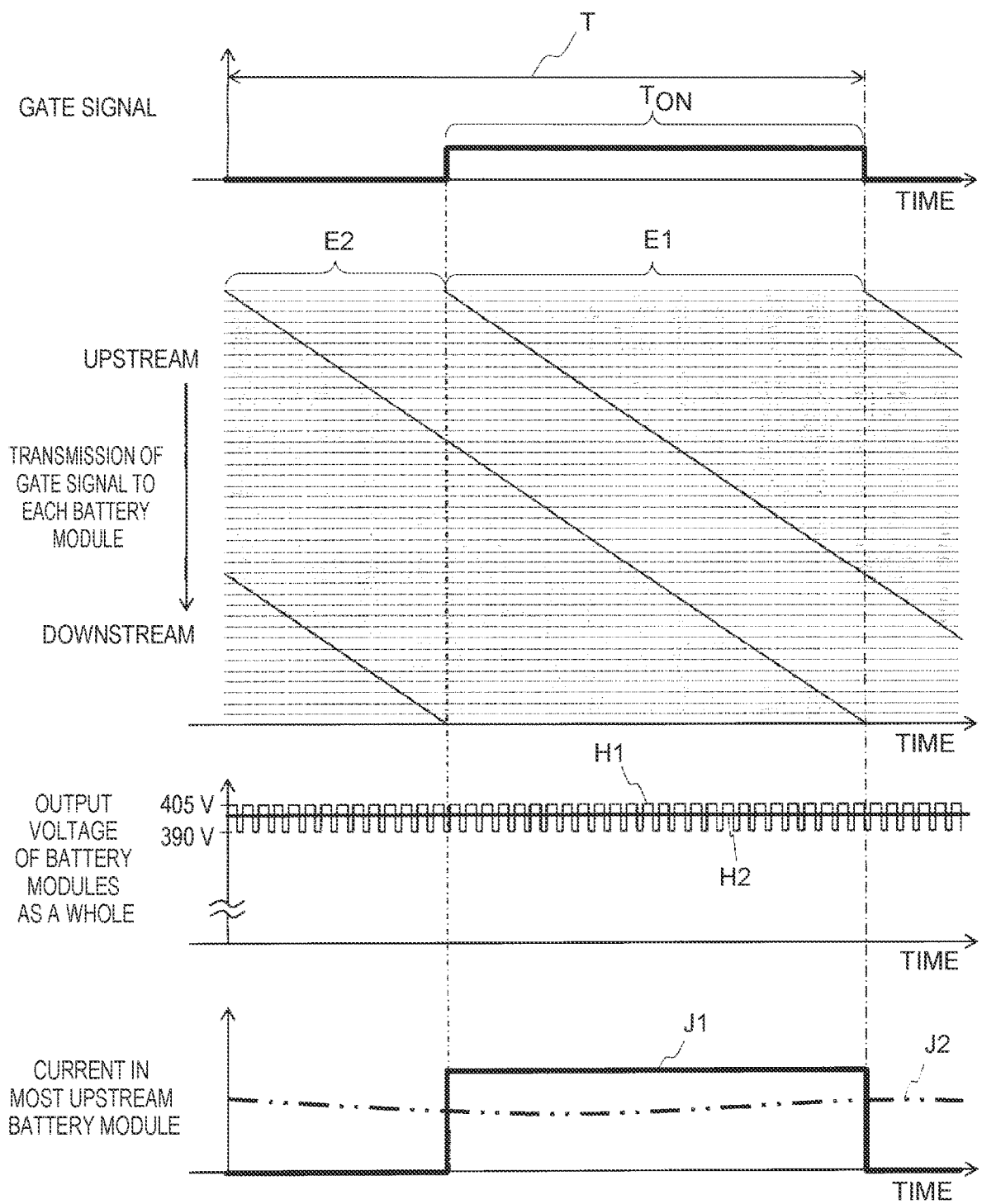
FIG. 4 is a diagram illustrating control of the power supply device according to the embodiment of the present disclosure.

FIG. 4 illustrates a state in which the battery modules 102a, 102b, 102c, ... 102n are sequentially driven. As illustrated in FIG. 4, the battery modules 102a, 102b, 102c, ... 102n are driven one after another from the upstream side to the downstream side, each with a certain delay time ($T_{delay}$) in response to the gate driving signal.

In FIG. 4, reference numeral E1 indicates a state in which the first switch elements 16 of the battery modules 102a, 102b, 102c, ... 102n are off and the second switch elements 18 of the battery modules 102a, 102b, 102c, ... 102n are on, which is a state in which the battery modules 102a, 102b, 102c, ... 102n each output a voltage from the relevant output terminal OT (connected state). Also, reference numeral E2 indicates a state in which the first switch elements 16 of the battery modules 102a, 102b, 102c, ... 102n are on and the second switch elements 18 of the battery modules 102a, 102b, 102c, ... 102n are off, which is a state in which the battery modules 102a, 102b, 102c, ... 102n each do not output a voltage from the relevant output terminal OT (pass-through state). As described above, the battery modules 102a, 102b, 102c, ... 102n are sequentially driven, each with a certain delay time ($T_{delay}$).

Next, the gate driving signal and setting of delay time ($T_{delay}$) for the gate driving signal will be described. A cycle T of the gate driving signal is set by adding up the delay times ($T_{delay}$) of the respective the battery modules 102a, 102b, 102c, ... 102n. For example, if N battery modules 102a, 102b, 102c, ... 102n operate with a same delay time ($T_{delay}$), the cycle T of the gate driving signal is represented by $T=N \times T_{delay}$. Therefore, if the delay time ($T_{delay}$) is set to be long, a frequency of the gate driving signal becomes low.

On the other hand, if the delay time ($T_{delay}$) is set to be short, the frequency of gate driving signal becomes high. Also, the delay time ($T_{delay}$) by which gate driving signal is delayed can appropriately be set according to required specifications required for the power supply device 100.

An on-time ratio (on-duty) D in the cycle T of the gate driving signal, that is, a ratio of an on-time period $T_{ON}$ in the cycle T can be calculated by (output voltage of the power supply device 100)/(total voltage of all the battery modules 102a, 102b, 102c, . . . 102n). The total voltage of the battery modules 102a, 102b, 102c, . . . 102n can be calculated by a battery voltage of a battery module×the number of battery modules. In other words, the on-time ratio D=the output voltage of the power supply device/(the battery voltage of the battery module×the number of battery modules). To be exact, the on-time ratio has an error corresponding to the dead time dt, and thus, the on-time ratio is corrected by means of feedback or feedforward in such a manner as generally performed in chopper circuits.

As described above, an output voltage $V_{out}$ of the power supply device 100 can be represented by the battery voltage (mean voltage $V_{mean}$) of the battery module×the number of on-state battery modules ($N_{ON}$). In this case, the on-time period $T_{ON}$ is represented by $T_{ON}=V_{out} \times T_{delay}/V_{mean}$ using the output voltage $V_{out}$ of the power supply device 100, the mean voltage $V_{mean}$ of the battery module battery voltage and the delay time $T_{delay}$.

When the battery module 102a, 102b, 102c, . . . 102n are sequentially driven, the output characteristic of rectangular waves indicated by reference numeral H1 in FIG. 4 is obtained. In other words, a voltage that varies in a cycle calculated by the cycle T of the gate driving signal/the number of battery modules is obtained. This variation is filtered out by parasitic inductance caused by wirings of the battery modules 102a, 102b, 102c, . . . 102n, and as indicated by reference numeral H2, the power supply device 100 outputs a more stable voltage $V_{out}$ in its entirety.

As described above, when the power supply device 100 is driven, the gate driving signal output to the battery module 102a on the most upstream side is delayed by a certain time and output to the battery module 102b on the downstream side, and furthermore, the gate driving signal is delayed by a certain time and transmitted in turn to the battery module on the downstream side, and thus, each of the battery modules 102a, 102b, 102c, . . . 102n outputs a voltage with a delay of the certain time in turn. Then, a voltage of the power supply device 100 is output by adding up these voltages, enabling obtainment of a desired voltage.

Also, a desired voltage can easily be obtained by adjusting the on-time ratio D, enabling enhancement in versatility of the power supply device 100. In particular, even if a failure occurs in any of the battery modules 102a, 102b, 102c, . . . 102n and thus the relevant battery module becomes difficult to use, a desired voltage can be obtained using normal battery modules with the failed battery module excluded. In other words, even if a failure occurs in any of the battery modules 102a, 102b, 102c, . . . 102n, an output of a desired voltage can be continued.

Furthermore, the frequency of the gate driving signal becomes low by setting the delay time by which the gate driving signal is delayed to be long and, and thus, a switching frequency of each of the first switch element 16 and the second switch element 18 also becomes low, enabling reduction of switching loss and thus enabling enhancement in power conversion efficiency. Conversely, the frequency of the gate driving signal becomes high by setting the delay time by which the gate driving signal is delayed to be short, the frequency of voltage variation becomes high, facilitating filtering and thus enabling obtainment of a stable voltage. Also, smoothing of the current variation by an RLC filter is facilitated. As described above, a power supply device 100 that provides requested specifications and performance can be provided by adjusting a delay time by a gate driving signal is delayed.

ID Setting Processing

Processing for setting an ID unique to each of the battery modules 102 included in the power supply device 100 will be described below. In the present embodiment, an ID is set for each of the battery modules 102 by transmitting an ID setting signal from the upstream battery module 102a to the downstream battery module 102n using a gate signal line for transmitting the gate driving signal.

Figure 5:
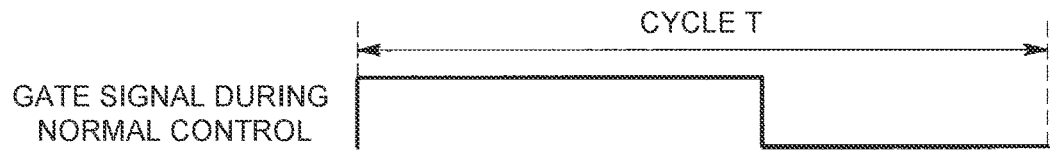
FIG. 5 is a diagram illustrating a method for superimposing an ID setting mode instruction pulse signal on the gate driving signal according to the embodiment of the present disclosure.
Figure 5:
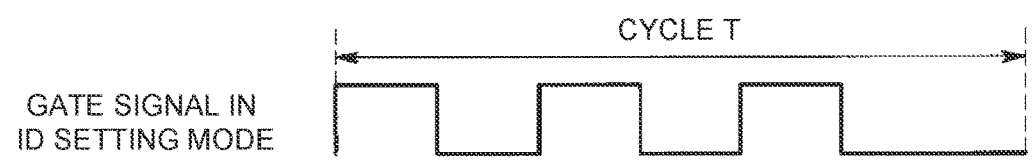
Figure 6:
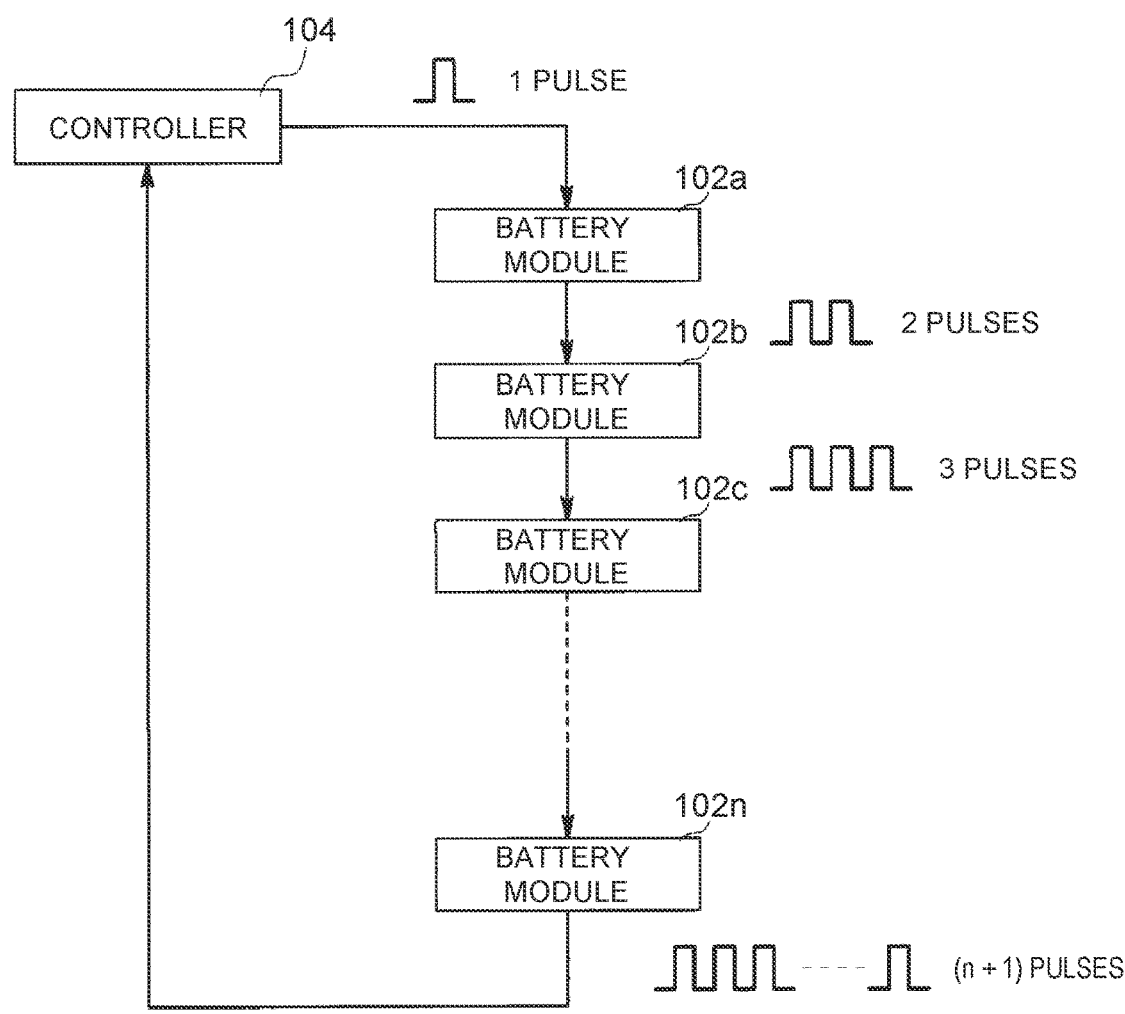
FIG. 6 is a diagram illustrating ID setting processing using the gate driving signal according to the embodiment of the present disclosure.

FIG. 5 illustrates an example of a method for causing the gate driving signal from the controller 104 to transmit the ID setting signal for the battery modules 102. During a period of the gate driving signal being on, the controller 104 adds an ID setting mode instruction pulses that are not used in the normal control. The example in FIG. 5 indicates an example in which an ID setting mode instruction pulse signal including three pulses in a cycle T of the gate driving signal are transmitted.

Upon reception of the ID setting mode instruction pulses, the gate driving signal processing circuit 20 in each of the battery modules 102 transitions to an ID setting mode. In the ID setting mode, each of the gate driving signal processing circuits 20 does not control the first switch element 16 and the second switch element 18 based on the received gate driving signal. Each of the gate driving signal processing circuits 20 feeds out the received ID setting mode instruction pulses to the subsequent battery module 102 in turn. Consequently, all the battery modules 102 included in the power supply device 100 can be made to transition to the ID setting mode.

While in the present embodiment, upon reception of ID setting mode instruction pulses including three pulses, each gate driving signal processing circuit 20 transitions to the ID setting mode, each gate driving signal processing circuit 20 may be configured to enter a mode for ID setting if the ID setting mode instruction signal agrees with a predetermined signal waveform for transition to the ID setting mode.

The controller 104 feeds out ID setting mode instruction pulses. Upon reception of the ID setting signal, the gate driving signal processing circuit 20 of each of the battery modules 102 sets an ID unique to the relevant battery module 102 according to the ID setting signal. Also, the gate driving signal processing circuit 20 of the battery module 102 changes the ID setting signal received from the preceding battery module 102 into a signal waveform for setting an ID unique to the subsequent battery module 102 and feeds out the resulting ID setting signal.

For example, the controller 104 feeds out the ID setting signal including one pulse to the most upstream battery module 102a. Upon reception of the ID setting signal, the gate driving signal processing circuit 20 of the most upstream battery module 102a sets an ID number corresponding to the number of pulses as an ID of the relevant battery module 102a. In other words, for the most upstream battery module 102a, ID number=1 is set. The gate driving signal processing circuit 20 of the battery module 102a adds one pulse to the received pulse and feeds out the pulses to the next battery module 102b. Upon reception of the ID setting signal, the gate driving signal processing circuit 20 of the battery module 102b sets an ID number corresponding to the number of pulses as an ID for the relevant battery module 102*b*. In other words, in the battery module 102*b*, ID number=2 is set. The gate driving signal processing circuit 20 of the battery module 102*b* adds one pulse to the received pulses and feeds out the resulting pulses to the next battery module 102*c*. As a result of repetition of such processing, the ID numbers are set up to the most downstream battery module 102*n*.

The gate driving signal processing circuit 20 of the battery module 102*n* adds one pulse to the received pulses and feeds out the resulting pulses to the controller 104. Upon reception of a signal from the battery module 102*n*, the controller 104 can obtain the numbers of connected battery modules 102 included in the power supply device 100 by subtracting one from the number of received pulses.

During an on-time period of the gate driving signal, the controller 104 adds an ID setting mode cancellation pulse that is not used in the normal control and feeds out the resulting gate driving signal. The gate driving signal processing circuit 20 of each of the battery modules 102 cancels the ID setting mode upon reception of the ID setting mode cancellation pulse using the gate signal line for transmitting the gate driving signal.

As described above, in the power supply device 100 in the present embodiment, the ID setting signal can be used for setting an ID number for each of the battery modules 102, using the gate signal line for transmitting the gate driving signal.

While in the present embodiment, an ID number is set for each of the battery modules 102 according to the number of pulses received by the relevant gate driving signal processing circuit 20, an ID number may be set for each of the battery modules 102 according to a pulse width (temporal length of a pulse) or an amplitude of a pulse.

What is claimed is:

1. A power supply device including a plurality of battery modules each including a secondary battery, in which the plurality of battery modules are connected in series to one another according to a gate driving signal from a controller and in each of the plurality of battery modules, the gate driving signal is delayed in a gate driving signal processing circuit included in a battery module and then transmitted from upstream to downstream of the series connection, wherein an ID is provided for each of the plurality of battery modules by transmitting an ID setting mode instruction signal for providing an ID unique to each battery module using a gate signal line for transmitting the gate driving signal; and wherein the ID setting mode instruction signal has a pulse waveform; and the gate driving signal processing circuit changes a number of pulses of the ID setting mode instruction signal received from the preceding battery module to a number of pulses for setting an ID unique to the subsequent battery module.

2. The power supply device according to claim 1, wherein if the ID setting mode instruction signal agrees with a predetermined signal waveform for transition to an ID setting mode, the gate driving signal processing circuit enters a mode for ID setting.

3. The power supply device according to claim 1, wherein the gate driving signal processing circuit changes the ID setting mode instruction signal received from the preceding battery module into a signal waveform for setting an ID unique to the subsequent battery module.

4. The power supply device according to claim 1, wherein the gate driving signal is returned from the most downstream battery module to the controller, and the controller acquires a number of connected battery modules based on the returned ID setting signal.

* * * * *